(12) United States Patent
Curtis et al.

(10) Patent No.: US 10,809,778 B2
(45) Date of Patent: Oct. 20, 2020

(54) SYSTEMS AND METHODS FOR INFORMATION HANDLING SYSTEM RACK AND TILE AIRFLOW COORDINATION

(71) Applicant: Dell Products L.P., Round Rock, TX (US)

(72) Inventors: Robert B. Curtis, Georgetown, TX (US); Randall Smith, Liberty Hill, TX (US)

(73) Assignee: Dell Products L.P., Round Rock, TX (US)

( * ) Notice: Subject to any disclaimer, the term of this patent is extended or adjusted under 35 U.S.C. 154(b) by 302 days.

(21) Appl. No.: 15/609,646

(22) Filed: May 31, 2017

(65) Prior Publication Data

US 2018/0348829 A1 Dec. 6, 2018

(51) Int. Cl.
*G06F 1/20* (2006.01)
*H05K 7/20* (2006.01)

(52) U.S. Cl.
CPC ......... *G06F 1/206* (2013.01); *H05K 7/20727* (2013.01)

(58) Field of Classification Search
CPC ...... G06F 1/206; G05B 15/02; H05K 7/20736
USPC ....................................................... 700/300
See application file for complete search history.

(56) References Cited

U.S. PATENT DOCUMENTS

| | | | |
|---|---|---|---|
| 2007/0129000 A1* | 6/2007 | Rasmussen | H05K 7/20572 454/184 |
| 2009/0205416 A1* | 8/2009 | Campbell | G01F 1/34 73/202.5 |
| 2009/0207567 A1* | 8/2009 | Campbell | F28D 15/00 361/696 |
| 2010/0029193 A1* | 2/2010 | Ahladas | H05K 7/2079 454/184 |
| 2012/0026691 A1* | 2/2012 | Campbell | H05K 7/20781 361/700 |
| 2015/0311952 A1* | 10/2015 | Varma | H04L 41/069 455/41.1 |

* cited by examiner

Primary Examiner — Jigneshkumar C Patel
(74) Attorney, Agent, or Firm — Jackson Walker L.L.P.

(57) ABSTRACT

In accordance with embodiments of the present disclosure, an information handling system enclosure may include a plurality of slots, each slot configured to receive an information handling system and a rack tile airflow controller communicatively coupled to the plurality of slots. The rack tile airflow controller may be configured to receive from each information handling system an indication of an individual airflow consumption of the information handling systems, aggregate the individual airflow consumptions of the information handling systems to determine a total enclosure-level airflow, and communicate one or more control signals to an active floor tile in fluid communication with the information handling system enclosure, the active floor tile including one or more air movers, and the one or more control signals for controlling a tile airflow generated by the one or more air movers in accordance with the total enclosure-level airflow.

12 Claims, 2 Drawing Sheets

SYSTEMS AND METHODS FOR INFORMATION HANDLING SYSTEM RACK AND TILE AIRFLOW COORDINATION

TECHNICAL FIELD

The present disclosure relates in general to information handling systems, and more particularly to systems and methods for providing power and thermal support of information handling resources in an information handling system.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM) and other components in information handling systems have increased in clock speed and power consumption, the amount of heat produced by such components as a side-effect of normal operation has also increased. Often, the temperatures of these components need to be kept within a reasonable range to prevent overheating, instability, malfunction and damage leading to a shortened component lifespan. Accordingly, air movers (e.g., cooling fans and blowers) have often been used in information handling systems to cool information handling systems and their components.

As system densities increase, airflow requirements continue to rise, causing airflow requirements of racks of information handling systems to also increase. Rack airflow can reach levels that push the limits of existing passive floor tile capability, thus at times may require active floor tiles (e.g., floor tiles with integrated air movers) in order to provide enough airflow for the assigned rack. However, existing solutions lack a closely coupled or coordinated airflow scheme between racks and active floor tiles that supply airflow to the racks.

SUMMARY

In accordance with the teachings of the present disclosure, the disadvantages and problems associated with thermal control in information handling systems may be reduced or eliminated.

In accordance with embodiments of the present disclosure, an information handling system enclosure may include a plurality of slots, each slot configured to receive an information handling system and a rack tile airflow controller communicatively coupled to the plurality of slots. The rack tile airflow controller may be configured to receive from each information handling system an indication of an individual airflow consumption of the information handling systems, aggregate the individual airflow consumptions of the information handling systems to determine a total enclosure-level airflow, and communicate one or more control signals to an active floor tile in fluid communication with the information handling system enclosure, the active floor tile including one or more air movers, and the one or more control signals for controlling a tile airflow generated by the one or more air movers in accordance with the total enclosure-level airflow.

In accordance with these and other embodiments of the present disclosure, a method may include receiving from each information handling system disposed in an enclosure an indication of an individual airflow consumption of the information handling systems, aggregating the individual airflow consumptions of the information handling systems to determine a total enclosure-level airflow, and communicating one or more control signals to an active floor tile in fluid communication with the enclosure, the active floor tile including one or more air movers, and the one or more control signals for controlling a tile airflow generated by the one or more air movers in accordance with the total enclosure-level airflow.

In accordance with these and other embodiments of the present disclosure, an article of manufacture may include a non-transitory computer readable medium and computer-executable instructions carried on the computer readable medium, the instructions readable by a processor, the instructions, when read and executed, for causing the processor to: (i) receive from each information handling system disposed in an enclosure an indication of an individual airflow consumption of the information handling systems; (ii) aggregate the individual airflow consumptions of the information handling systems to determine a total enclosure-level airflow; and (iii) communicate one or more control signals to an active floor tile in fluid communication with the enclosure, the active floor tile including one or more air movers, and the one or more control signals for controlling a tile airflow generated by the one or more air movers in accordance with the total enclosure-level airflow.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
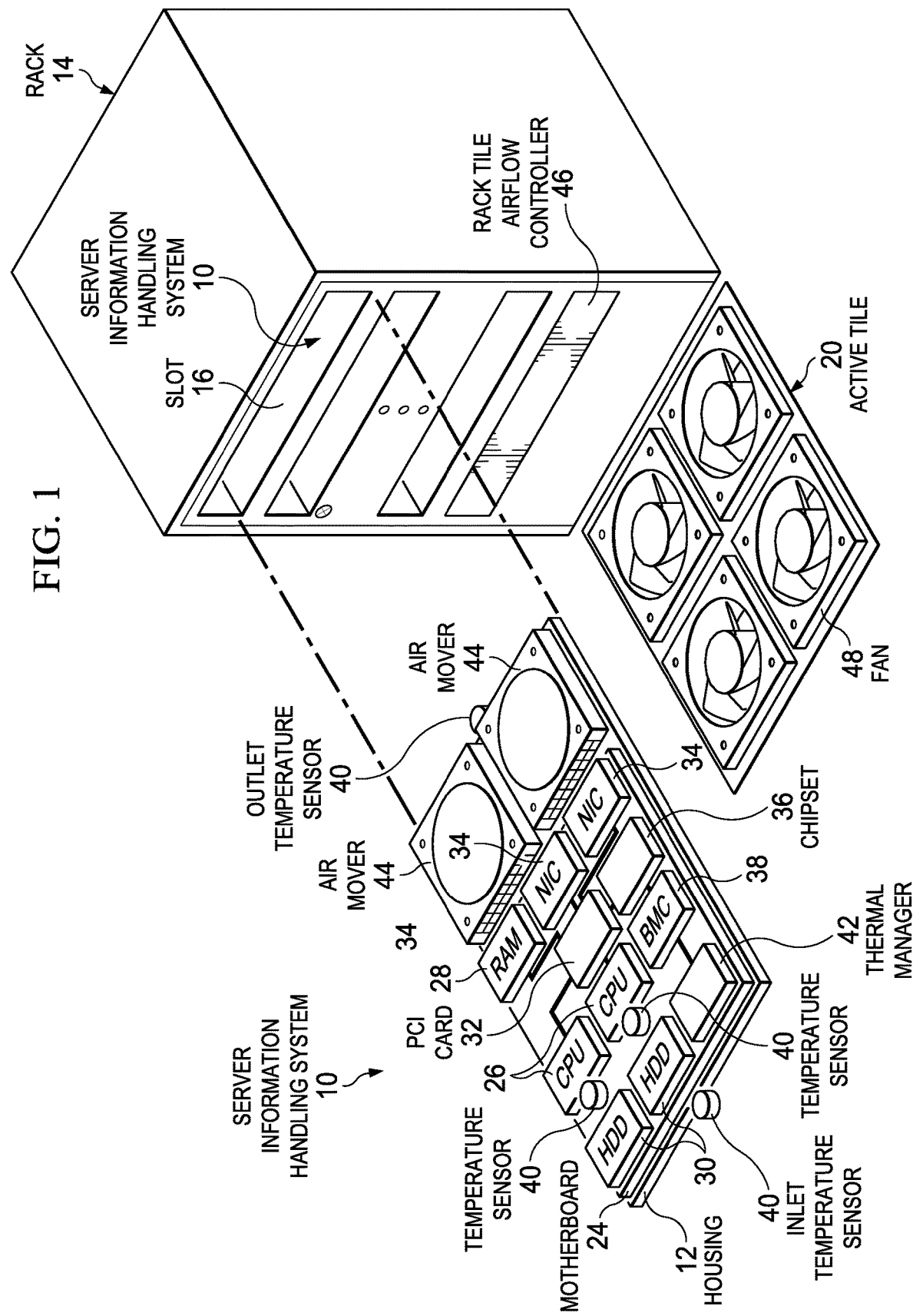
FIG. 1 illustrates a perspective view of an example information handling system, in accordance with embodiments of the present disclosure.
Figure 2:
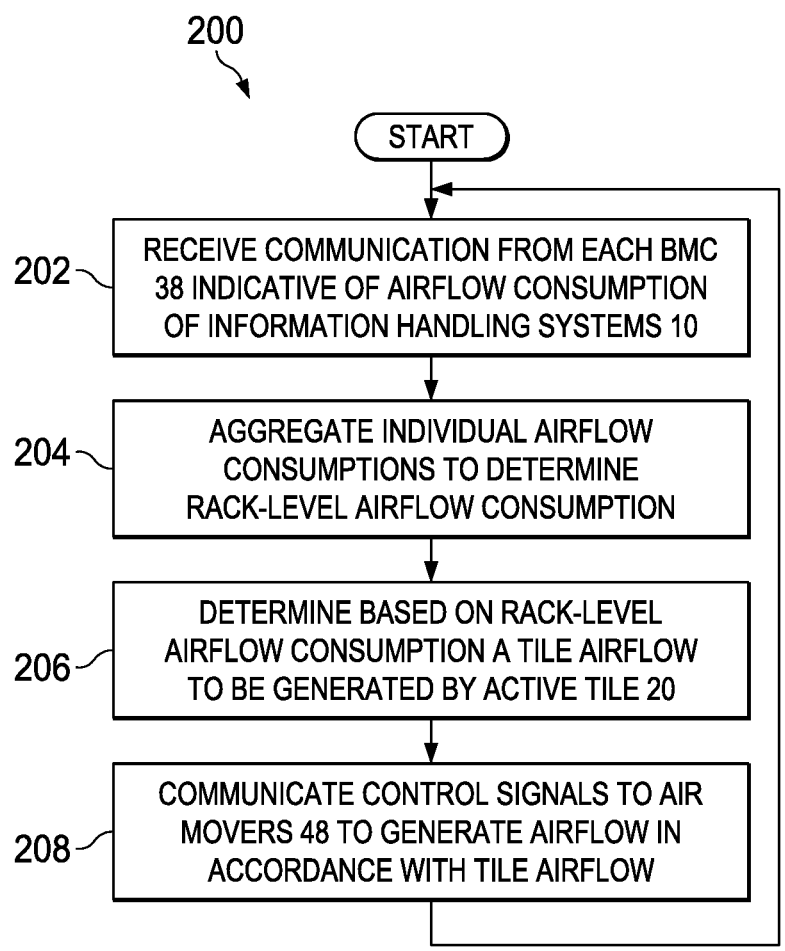
FIG. 2 illustrates a flow chart of an example method for coordination of airflow between air movers of the example information handling system of FIG. 1 and air movers of the example active floor tile of FIG. 1, in accordance with embodiments of the present disclosure.

Preferred embodiments and their advantages are best understood by reference to FIGS. 1 and 2, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, buses, memories, I/O devices and/or interfaces, storage resources, network interfaces, motherboards, integrated circuit packages; electro-mechanical devices (e.g., air movers), displays, and power supplies.

FIG. 1 illustrates a perspective view of an example information handling system 10, in accordance with embodiments of the present disclosure. As shown in FIG. 1, information handling system 10 may comprise a server built into a housing 12 that resides with one or more other information handling systems 10 in a rack 14. Rack 14 may comprise a plurality of vertically-stacked slots 16 that accept information handling systems 10 and a rack tile airflow controller 46. In a data center environment, rack 14 may receive pretreated cooling air provided from an active floor tile 20 to aid removal of thermal energy from information handling systems 10 disposed in rack 14.

Housing 12 may include a motherboard 24 that provides structural support and electrical signal communication for processing components disposed in housing 12 that cooperate to process information. For example, one or more central processing units (CPUs) 26 may execute instructions stored in random access memory (RAM) 28 to process information, such as responses to server requests by client information handling systems remote from information handling system 10. One or more persistent storage devices, such as hard disk drives (HDD) 30 may store information maintained for extended periods and during power off states. A backplane communications manager, such as a PCI card 32, may interface processing components to communicate processed information, such as communications between CPUs 26 and network interface cards (NICs) 34 that are sent through a network, such as a local area network. A chipset 36 may include various processing and firmware resources for coordinating the interactions of processing components, such as a basic input/output system (BIOS). A baseboard management controller (BMC) 38 may interface with chipset 36 to provide out-of-band management functions, such as remote power up, remote power down, firmware updates, and power management. For example, BMC 38 may receive temperatures sensed by temperature sensors 40 and apply the temperatures to ensure that thermal constraints are not exceeded.

A thermal manager 42 may execute as firmware, software, or other executable code on BMC 38 to manage thermal conditions within housing 12, such as the thermal state at particular processing components or ambient temperatures at discrete locations associated with housing 12. Thermal manager 42 may control the speed at which air movers 44 (e.g., fans or blowers) rotate to adjust a cooling airflow rate in housing 12 so that enough excess thermal energy is removed to prevent an over-temperature condition, such as overheating of a CPU 26 or an excessive exhaust temperature as measured by an outlet temperature sensor 40. In the event that air movers 44 cannot provide sufficient cooling airflow to meet a thermal constraint, thermal manager 42 may reduce power consumption at one or more of the processing components to reduce the amount of thermal energy released into housing 12, such as by throttling the clock speed of one or more of CPUs 26. Thermal manager 42 may respond to extreme thermal conditions that place system integrity in jeopardy by shutting down information handling system 10, such as might happen if active floor title 20 fails to provide treated air due to a data center cooling system failure.

In some embodiments, in order to more effectively manage thermal conditions associated with housing 12, thermal manager 42 may apply conservation of energy to estimate thermal conditions at discrete locations associated within housing 12 and then use the estimated thermal conditions for more precise control of the overall thermal state of information handling system 10. For example, thermal manager 42 may perform one or more energy balances based upon available measures of power consumption, air mover speed, and sensed thermal conditions to estimate intermediate temperatures at discrete locations within housing 12. The estimated intermediate temperatures may provide more precise control of the thermal conditions at discrete locations to maintain thermal constraints, such as maximum ambient temperatures of components that do not include temperature sensors or maximum inlet temperatures for components downstream in the cooling airflow from the estimated ambient temperature. Estimated intermediate temperatures may be applied in an overall system conservation of energy model so that fan speed and component power consumption are determined to maintain thermal constraints, such as maximum exhaust temperatures. Thermal manager 42 may estimate discrete thermal conditions at locations within housing 12 by applying available component configuration information, such as a component inventory kept by BMC 38, and sensed, known, or estimated power consumption of the components. For example, BMC 38 may use actual power consumption of components or subassemblies if actual power consumption is available, known power consumption stored in the BMC inventory for known components, or estimated power consumption based upon the type of component and the component's own configuration. An example of estimated power consumption is a general estimate of power consumption stored in BMC 38 for unknown PCI cards 32 with the general estimate based upon the width of the PCI card, i.e., the number of links supported by the PCI card. In one embodiment, as estimated intermediate thermal conditions are applied to generate fan and power consumption settings, a self-learning function may compare expected results and models to component and subassembly thermal characteristics so that more accurate estimates are provided over time.

A rack tile airflow controller 46 may comprise any suitable system, device, or apparatus configured to receive and aggregate the reported airflow consumption from individual BMCs 38 within rack 14 to determine a total rack-level airflow consumption, and based on such total rack-level airflow consumption, manipulate the speed of air movers 48 of active floor tile 20 sitting in front of, below, or otherwise proximate to rack 14 in order to support the total rack-level airflow consumption. In order to control the speed of air movers 48, rack tile airflow controller 46 may be communicatively coupled to motors of air movers 48 in order to communicate control signals for controlling the speed of air movers 48. Accordingly, as real-time loads within the information handling systems 10 of rack 14 fluctuate, thus in turn causing fluctuation in the airflow consumption by information handling systems 10 of rack 14, rack tile airflow controller 46 may manipulate air movers 48 of active floor tile 20 to match such real-time airflow consumption.

In some embodiments, rack tile airflow controller 46 may be configured to generate additional airflow beyond the aggregate airflow reported by BMCs 38. Such overprovisioning of airflow may mitigate airflow leakage within rack 14 and/or hot air recirculation that may occur (e.g., at the top of rack 14). Such overprovisioning of airflow may also provide additional airflow to components of rack 14 that are not capable of or do not otherwise report airflow consumption to rack tile airflow controller 46.

In these and other embodiments, in the event that air movers 48 cannot provide sufficient cooling airflow to meet the total rack-level airflow consumption, rack tile airflow controller 46 may communicate appropriate alerts to a user or to BMCs 38, such that thermal managers 42 within rack 14 may reduce power consumption at one or more of the processing components to reduce the amount of thermal energy released into housing 12, such as by throttling the clock speed of one or more of CPUs 26, or take other actions to reduce thermal energy released in rack 14.

In some embodiments, multiple active floor tiles 20 may be communicatively linked together in the event multiple floor tiles are required to meet airflow requirements of rack 14. In addition, in datacenters utilizing cold-aisle containment, multiple active floor tiles 20 and rack tile airflow controllers 46 may be communicatively linked together to ensure that a total amount of airflow supplied to a cold aisle matches the aggregate of all racks 14 coupled to the cold aisle.

FIG. 2 illustrates a flow chart of an example method 200 for coordination of airflow between air movers 44 of rack 14 and air movers 48 of the example active floor tile 20, in accordance with embodiments of the present disclosure. According to certain embodiments, method 200 may begin at step 202. As noted above, teachings of the present disclosure may be implemented in a variety of configurations of rack 14 and server information handling systems 10. As such, the preferred initialization point for method 200 and the order of the steps comprising method 200 may depend on the implementation chosen. In these and other embodiments, method 200 may be implemented as firmware, software, applications, functions, libraries, or other instructions.

At step 202, rack tile airflow controller 46 may receive a communication from each BMC 38 within rack 14 indicative of the airflow consumption of the information handling system 10 associated with such BMC 38. At step 204, rack tile airflow controller 46 may aggregate the individual airflow consumptions of the information handling systems 10 to determine a total rack-level airflow consumption. At step 206, rack tile airflow controller 46 may determine, based on the total rack-level airflow consumption, a tile airflow to be generated by air movers 48 of active floor tile 20. At step 208, rack tile airflow controller 46 may communicate control signals to air movers 48 of active floor tile 20 to cause air movers 48 of active floor tile 20 to generate airflow in accordance with the tile airflow. After step 208, method 200 may return to step 202.

Although FIG. 2 discloses a particular number of steps to be taken with respect to method 200, method 200 may be executed with greater or fewer steps than those depicted in FIG. 2. In addition, although FIG. 2 discloses a certain order of steps to be taken with respect to method 200, the steps comprising method 200 may be completed in any suitable order.

Method 200 may be implemented using BMC 38, thermal manager 42, rack tile airflow controller 46, components thereof, and/or any other system operable to implement method 200. In certain embodiments, method 200 may be implemented partially or fully in software and/or firmware embodied in computer-readable media.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. An information handling system enclosure comprising:
   a plurality of slots, each slot configured to receive an information handling system; and
   a rack tile airflow controller communicatively coupled to the plurality of slots and configured to:
      receive, from each information handling system, an indication of an individual airflow consumption of that information handling system;
      aggregate the individual airflow consumptions of the information handling systems to determine a total enclosure-level airflow requirement;
      communicate one or more control signals to an active floor tile in fluid communication with the information handling system enclosure, the active floor tile including one or more air movers integrated as components of the active floor tile, and the one or more control signals for controlling a tile airflow generated by the one or more air movers in accordance with the total enclosure-level airflow requirement; and
      communicate the one or more control signals to a second active floor tile in fluid communication with the enclosure, the second active floor tile including one or more additional air movers integrated as components of the second active floor tile, and the one or more control signals for controlling a second tile airflow generated by the one or more additional air movers in accordance with the total enclosure-level airflow requirement;
      wherein the tile airflow and the second tile airflow are determined to have a sum that is at least as large as the total enclosure-level airflow requirement.

2. The information handling system of claim 1, wherein the rack tile airflow controller is further configured to cause the one or more air movers of the active floor tile to generate more airflow than the total enclosure-level airflow requirement.

3. The information handling system of claim 2, wherein the more airflow is operable to mitigate at least one of airflow leakage within the information handling system enclosure and hot air recirculation proximate to the information handling system enclosure.

4. The information handling system of claim 1, wherein the rack tile airflow controller is further configured to communicate an alert to the information handling systems in the event that the one or more air movers of the active floor tile are unable to provide sufficient cooling airflow to meet the total enclosure-level airflow requirement.

5. A method comprising:
   receiving, from each information handling system disposed in an enclosure, an indication of an individual airflow consumption of that information handling system;
   aggregating the individual airflow consumptions of the information handling systems to determine a total enclosure-level airflow requirement;
   communicating one or more control signals to an active floor tile in fluid communication with the enclosure, the active floor tile including one or more air movers integrated as components of the active floor tile, and the one or more control signals for controlling a tile airflow generated by the one or more air movers in accordance with the total enclosure-level airflow requirement; and
   communicating the one or more control signals to a second active floor tile in fluid communication with the enclosure, the second active floor tile including one or more additional air movers integrated as components of the second active floor tile, and the one or more control signals for controlling a second tile airflow generated by the one or more additional air movers in accordance with the total enclosure-level airflow requirement;
   wherein the tile airflow and the second tile airflow are determined to have a sum that is at least as large as the total enclosure-level airflow requirement.

6. The method of claim 5, further comprising causing the one or more air movers of the active floor tile to generate more airflow than the total enclosure-level airflow requirement.

7. The method of claim 6, wherein the more airflow mitigates at least one of airflow leakage within the enclosure and hot air recirculation proximate to the enclosure.

8. The method of claim 5, further comprising communicating an alert to the information handling systems in the event that the one or more air movers of the active floor tile are unable to provide sufficient cooling airflow to meet the total enclosure-level airflow requirement.

9. An article of manufacture, comprising
   a non-transitory computer readable medium; and
   computer-executable instructions carried on the computer readable medium, the instructions readable by a processor, the instructions, when read and executed, for causing the processor to:
      receive, from each information handling system disposed in an enclosure, an indication of an individual airflow consumption of that information handling system;
      aggregate the individual airflow consumptions of the information handling systems to determine a total enclosure-level airflow requirement;
      communicate one or more control signals to an active floor tile in fluid communication with the enclosure, the active floor tile including one or more air movers integrated as components of the active floor tile, and the one or more control signals for controlling a tile airflow generated by the one or more air movers in accordance with the total enclosure-level airflow requirement; and
      communicate the one or more control signals to a second active floor tile in fluid communication with the enclosure, the second active floor tile including one or more additional air movers integrated as components of the second active floor tile, and the one or more control signals for controlling a second tile airflow generated by the one or more additional air movers in accordance with the total enclosure-level airflow requirement;
      wherein the tile airflow and the second tile airflow are determined to have a sum that is at least as large as the total enclosure-level airflow requirement.

10. The article of claim 9, the instructions for further causing the processor to cause the one or more air movers of the active floor tile to generate more airflow than the total enclosure-level airflow requirement.

11. The article of claim 10, wherein the more airflow is operable to mitigate at least one of airflow leakage within the enclosure and hot air recirculation proximate to the enclosure.

12. The article of claim 9, the instructions for further causing the processor to communicate an alert to the information handling systems in the event that the one or more air movers of the active floor tile are unable to provide sufficient cooling airflow to meet the total enclosure-level airflow requirement.

* * * * *